United States Patent
Capsal et al.

(10) Patent No.: US 8,877,085 B2
(45) Date of Patent: Nov. 4, 2014

(54) PIEZOELECTRIC AND/OR PYROELECTRIC COMPOSITE SOLID MATERIAL, METHOD FOR OBTAINING SAME AND USE OF SUCH A MATERIAL

(75) Inventors: Jean-Fabien Capsal, Toulouse (FR); Charlotte David, Toulouse (FR); Eric Dantras, Toulouse (FR); Colette Lacabanne, Toulouse (FR)

(73) Assignee: Universite Paul Sabatier Toulouse III, Toulouse (FR)

( * ) Notice: Subject to any disclaimer, the term of this patent is extended or adjusted under 35 U.S.C. 154(b) by 154 days.

(21) Appl. No.: 13/514,461
(22) PCT Filed: Dec. 3, 2010
(86) PCT No.: PCT/FR2010/052609
§ 371 (c)(1), (2), (4) Date: Jul. 17, 2012
(87) PCT Pub. No.: WO2011/070275
PCT Pub. Date: Jun. 16, 2011

(65) Prior Publication Data
US 2012/0267563 A1   Oct. 25, 2012

(30) Foreign Application Priority Data
Dec. 11, 2009 (FR) ..................... 09 05995

(51) Int. Cl.
*H01L 37/00* (2006.01)
*H01L 41/18* (2006.01)
(Continued)

(52) U.S. Cl.
CPC ... *C04B 35/62259* (2013.01); *C04B 2235/3215* (2013.01); *C04B 35/6263* (2013.01); *C04B*
(Continued)

(58) Field of Classification Search
USPC ............. 252/519.33, 62.9 R, 511; 264/435; 977/783, 812, 837; 428/461, 689, 692
See application file for complete search history.

(56) References Cited

U.S. PATENT DOCUMENTS

| 6,882,051 B2 * | 4/2005 | Majumdar et al. ............ 257/746 |
| 2009/0056094 A1 * | 3/2009 | Shi et al. ...................... 29/25.35 |
| 2010/0294976 A1 * | 11/2010 | Ajayan et al. .......... 252/62.9 PZ |

OTHER PUBLICATIONS

Ogut E et al: "Poly (vinylidene fluoride)/zinc oxide smart composite material", Proceedings of the SPIE—The International Society for Optical Engineering SPIE—The International Society for Optical Engineering USA, vol. 6526, 2007, XP002588615, ISSN: 0277-786X p. 652600/3, ligne 15-ligne 22 figures 2,4 p. 652600/5, ligne3-ligne 6 p. 652600/6, ligne 12-ligne 16.

(Continued)

*Primary Examiner* — Carol M Koslow
(74) *Attorney, Agent, or Firm* — Young & Thompson

(57) ABSTRACT

A piezoelectric and/or pyroelectric composite solid hybrid material, includes: a solid dielectric matrix, a filler of at least one inorganic piezoelectric and/or pyroelectric material, wherein the filler includes filiform nanoparticles distributed throughout the volume of the solid dielectric matrix with an amount by volume of less than 50%, and in that the main directions of elongation of the filiform nanoparticles of the inorganic filler distributed in the dielectric matrix have a substantially isotropic distribution in the solid dielectric matrix. Also described is method for manufacturing and using such a hybrid material for producing structural parts and supported films deposited on the surface of such a substrate for: detecting mechanical stress by direct piezoelectric effect; detecting temperature variations by direct pyroelectric effect; creating a mechanical wave by reverse piezoelectric effect in a flexible audio device, in a de-icing device or in a mechanical anti-fouling device; and manufacturing a soundproof material.

15 Claims, 2 Drawing Sheets

Figure 1:
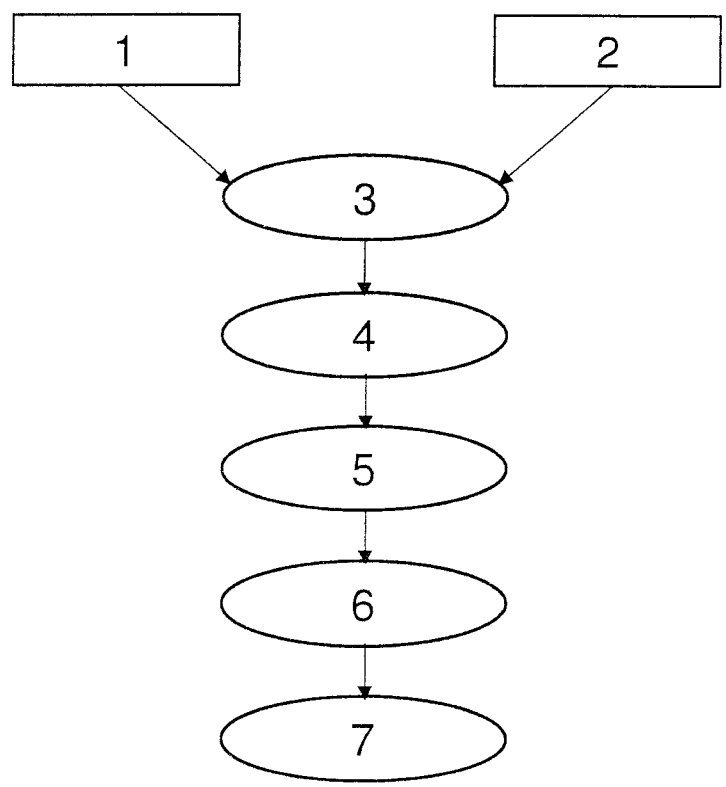

(51) Int. Cl.
*H01L 41/22* (2013.01)
*C04B 35/622* (2006.01)
*C04B 35/626* (2006.01)
*H01L 41/37* (2013.01)
*B82Y 30/00* (2011.01)

(52) U.S. Cl.
CPC ............ 2235/526 (2013.01); H01L 41/183 (2013.01); H01L 41/37 (2013.01); H01L 37/00 (2013.01); *C04B 2235/6028* (2013.01); *C04B 2235/5296* (2013.01); *C04B 2235/5284* (2013.01); *B82Y 30/00* (2013.01); *C04B 2235/5264* (2013.01); *Y10S 977/783* (2013.01); *Y10S 977/812* (2013.01); *Y10S 977/837* (2013.01)
USPC ............ 252/62.9 R; 252/511; 252/519.33; 264/435; 428/461; 428/689; 977/783; 977/812; 977/837

(56) References Cited

OTHER PUBLICATIONS

K.H. Lam et al.: "Piezoelectric and pyroelectric properties of 65PMN-35PT/P(VDF-TrFE) 0-3 composites", Composites Science and Technology 65 (2005) 1107-1111, Department of Applied Physics and Materials Research Centre, The Hong Kong Polytechnic University, Hung Hom, Kowloon, Hong Kong, PR China, Received Oct. 28, 2003; received in revised form Oct. 29, 2004; accepted Nov. 23, 2004, Available online Jan. 8, 2005.

Takeo Furukawa et al.: "Electromechanical Properties in the Composites of Epoxy Resin and PZT Ceramics", The Institute of Physical and Chemical Research, Wako, Saitama 351 (Received Jul. 8, 1976), Japanese Journal of Applied Physics, Vol. 15, No. 11, Nov. 1976 pp. 2119-2129.

International Search Report, dated Mar. 9, 2011, from corresponding PCT application.

\* cited by examiner

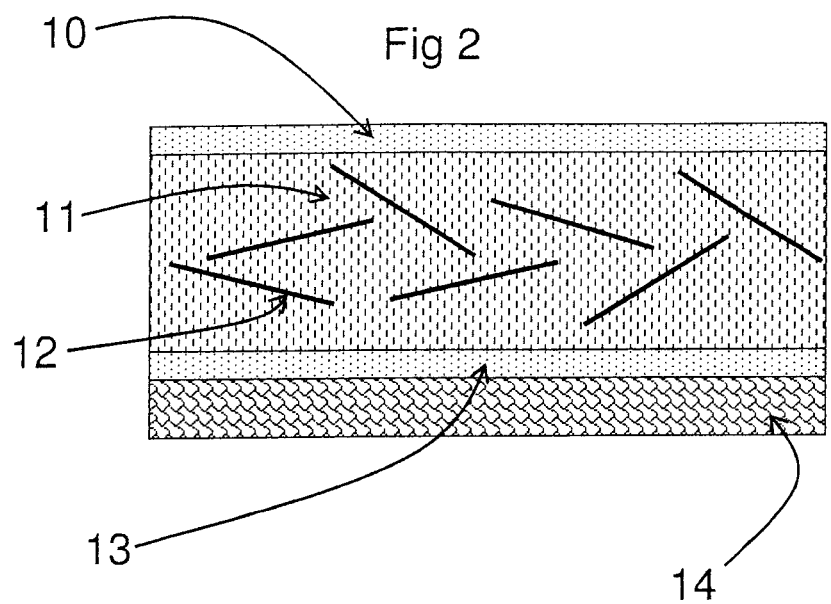
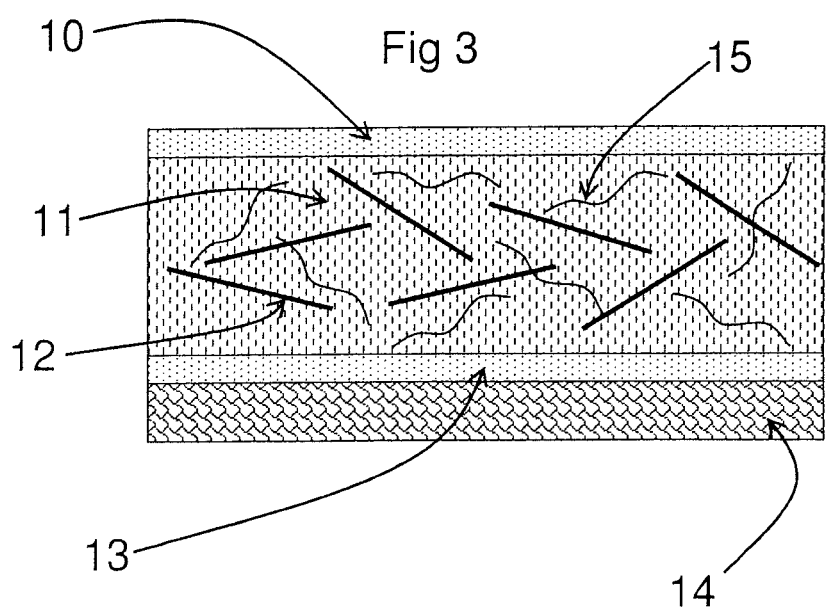

PIEZOELECTRIC AND/OR PYROELECTRIC COMPOSITE SOLID MATERIAL, METHOD FOR OBTAINING SAME AND USE OF SUCH A MATERIAL

The invention relates to a piezoelectric and/or pyroelectric composite solid material, to a method for obtaining same, and to the use of such a material.

The invention finds its applications in the field of acoustic transducers, piezoelectric resonators, pressure and/or acceleration sensors, actuators, especially direct actuators capable of generating displacement strokes of from 0.1 to 100 μm, in particular for atomic force microscopy and scanning tunneling microscopy, piezoelectric motors, piezoelectric generators and transformers, pyroelectric sensors, soundproofing materials, especially anechoic piezoelectric materials, materials having high dielectric permittivity, in particular for electronics and electrical engineering, and piezoelectric actuator materials.

It has already been proposed to incorporate fillers of micrometric or nanometric particles of a ferroelectric material of the PZT (lead zirconate titanate) type, in particular in the form of spherical nanoparticles, i.e., nanoparticles having an aspect ratio of approximately 1, into a polyepoxy matrix in order to form a piezoelectric composite material (see, for example, "Furukawa et al., (1976), *Japanese Journal of Applied Physics,* 15; 11, 2119-2129"). Such substantially spherical nanoparticles do not allow a sufficiently high connectivity state to be achieved in the composite material with a degree of filling that is sufficiently low and suitable for preserving the mechanical properties—mechanical resistance to shock, flexibility and ductility—of the matrix.

It is also known to use piezoelectric PMN-PT (lead/magnesium/niobium-lead/titanium) particles of substantially spherical morphology (see, for example, "Lam et al., (2005), *Composite Science and Technology,* 65, 1107-1111") in a polymer matrix in a proportion by volume of between 5% and 40%. Such a composite allows a value of the piezoelectric coefficient of between 10 and 30 pC/N to be achieved but does not allow the initial ductility of the matrix substantially to be retained.

The problem is, therefore, to obtain a composite solid material with high piezoelectricity and/or pyroelectricity, especially with a piezoelectric and/or pyroelectric efficiency which is greater than that of the piezoelectric and/or pyroelectric composite materials of the prior art, but without substantially impairing the mechanical properties of the composite solid material as compared with the mechanical properties of the matrix constituting said composite solid material.

Maximum piezoelectricity and/or pyroelectricity is (are) in fact obtained at the expense of an amount by volume greater than 25%, typically of approximately 50%, which modifies considerably the mechanical properties of the resulting composite material in relation to the mechanical properties of the matrix forming said composite solid material.

The invention aims to remedy the drawbacks mentioned above by proposing a composite solid material which, on the one hand, has the advantages of the composite materials in relation to the inorganic ferroelectric (ceramics) materials in terms of mechanical properties (especially greater lightness with at least equivalent, especially superior, flexibility, ductility and resistance to shocks), but which, on the other hand, has:

a dielectric permittivity (e) which is as low as possible, especially substantially less than 20, and a piezoelectric figure of merit $g_{33}$ ($d_{33}/\in$) greater than 45 mV·m/N, where $d_{33}$ is the piezoelectric coefficient of the composite material, and/or a pyroelectric figure of merit F (p/∈) greater than 0.7 μC/K/m², where p is the pyroelectric coefficient of the composite material.

The invention aims to propose such a piezoelectric and/or pyroelectric composite solid material which has a reduced degree of filling suitable for substantially preserving the mechanical properties of said composite solid material.

The invention further aims to propose such a composite solid material of reduced density with a piezoelectric and/or pyroelectric efficiency which is at least retained and especially is increased.

The invention relates further to such a piezoelectric composite solid material suitable for permitting increased elastic deformation under a given stress and an increased piezoelectric response for said stress.

The invention relates also to such a composite solid material which retains a high piezoelectric and/or pyroelectric response while having a proportion of functional filler that is reduced as compared with the composite materials of the prior art.

The invention relates in particular to a composite solid material which, unlike organic piezoelectric and/or pyroelectric materials, does not require the application of an intense electric field which may cause dielectric breakdown of said organic material in order to polarise said organic piezoelectric and/or pyroelectric material.

The invention accordingly aims to propose a composite solid material having mechanical properties comparable to those of polymer materials of the same nature and, at the same time, a piezoelectric figure of merit $d_{33}$ greater than 45 mV·m/ N.

The invention aims also to propose a composite solid material having mechanical properties comparable to those of composite insulating materials of the same nature and, at the same time, a pyroelectric figure of merit F greater than 0.7 μC/K/m².

The invention further aims to propose a composite solid material having flexibility, ductility, lightness and ease of use which are substantially equivalent to those of the polymer matrix and, at the same time, also the electroactive properties of the inorganic functional filler.

The invention aims also to propose such a composite solid material having improved properties of dissipation of vibrational energy, especially sound energy, in the form of heat.

The invention accordingly relates to a composite solid material having the properties of ductility, mechanical strength and low dielectric permittivity of organic polymer materials while at the same time having the electroactive properties of inorganic piezoelectric and/or pyroelectric materials and especially a low intensity of the electric field required for its polarisation.

More particularly, the invention aims to propose a composite solid material having a solid (homogeneous or composite) matrix of electrically insulating material, and a piezoelectric figure of merit $d_{33}$ greater than 45 mV·m/N and/or a pyroelectric figure of merit F greater than 0.7 μC/K/m², the final mechanical properties of the composite solid material according to the invention being at least 90% of those of the solid matrix.

The invention further aims to propose a composite solid material having a piezoelectric figure of merit $d_{33}$ greater than 45 mV·m/N, but in which the extra charge associated with the functional filler of piezoelectric and/or pyroelectric nanoparticles in the composite solid material substantially does not exceed 50%.

The invention relates also to a method of producing such a composite solid material which is simple, inexpensive and rapid to carry out, does not require any specific equipment and protects the environment.

The invention aims also to propose such a method permitting the production of parts of any shape having variable material compositions.

To that end, the invention relates to a piezoelectric and/or pyroelectric composite solid material, called hybrid material, comprising:
- a solid dielectric matrix,
- an inorganic filler distributed in the solid dielectric matrix, said inorganic filler being composed of a material selected from the group formed of piezoelectric materials, pyroelectric materials, and piezoelectric and pyroelectric materials, in which said inorganic filler comprises solid nanoparticles, called filiform nanoparticles, having:
- a length extending in a main direction of elongation of the filiform nanoparticles,
- two dimensions, called orthogonal dimensions, extending in two transverse directions which are mutually orthogonal and orthogonal to said main direction of elongation of the filiform nanoparticles, said orthogonal dimensions being smaller than said length and smaller than 500 nm, and
- two ratios, called aspect ratios, between said length and each of the two orthogonal dimensions, said aspect ratios being greater than 10, wherein said filiform nanoparticles are distributed in the volume of the solid dielectric matrix in an amount by volume of less than 50%, especially between 0.5% and 50%, preferably between 5% and 20%, in particular of approximately 12%, and in that the main directions of elongation of the filiform nanoparticles of the inorganic filler distributed in the dielectric matrix have a substantially isotropic distribution in the solid dielectric matrix.

In a hybrid material according to the invention, the solid dielectric matrix can advantageously be formed of at least one material selected from the group of the organic materials, that is to say materials composed of at least one organic compound having at least one covalent bond formed between a carbon atom and an atom other than carbon (in particular hydrogen).

In a hybrid material according to the invention, the solid dielectric matrix is preferably formed of a synthetic organic polymer material.

Advantageously, the solid dielectric matrix of a hybrid material according to the invention comprises a material selected from the group of the organic materials composed of at least one organic compound comprising at least one silicon atom.

Advantageously, the solid dielectric matrix of the hybrid material according to the invention is selected from the group formed of piezoelectric solid dielectric matrices, pyroelectric solid dielectric matrices, and solid dielectric matrices that are neutral from the electric point of view.

Advantageously and according to the invention, the solid dielectric matrix of the hybrid material is a continuous matrix in which said filiform nanoparticles are distributed throughout the volume of said solid dielectric matrix.

Advantageously, the inorganic filler of the hybrid material according to the invention is formed of a non-polymeric metallic compound not comprising carbon.

In a hybrid material according to the invention, the aspect ratio of a filiform nanoparticle is the ratio between the length of said filiform nanoparticle and one of its two dimensions orthogonal to said length. By way of example, an aspect ratio of 100 for a filiform nanoparticle of generally circular cylindrical shape means that its length is substantially equal to 100 times its average diameter. In any case, a filiform nanoparticle is of generally elongate shape in which the ratios of its largest dimension (its length) to each of the two orthogonal dimensions are greater than 10.

The inventors have observed that a hybrid material according to the invention in which the inorganic filler is formed of filiform nanoparticles composed of a piezoelectric and/or pyroelectric material, said filiform nanoparticles having a high aspect ratio and being distributed in the volume of the solid dielectric matrix in an amount by volume of less than 50%, permits increased bending deformation of the filiform nanoparticles, increased charge separation of the piezoelectric and/or pyroelectric material having a high aspect ratio, and a greater piezoelectric and/or pyroelectric effect for the same stress exerted on said hybrid material.

Advantageously, the filiform nanoparticles are distributed in the volume of the solid dielectric matrix in an amount by volume of less than 35%, especially between 1% and 35%, preferably between 5% and 30%.

More particularly, a hybrid material according to the invention is advantageously characterised by at least one of the following features:
- the two orthogonal dimensions of the filiform nanoparticles are between 50 nm and 500 nm, especially approximately 200 nm,
- the filiform nanoparticles have two aspect ratios greater than 10, especially greater than 100, in particular of approximately 250,
- the filiform nanoparticles have a length greater than 1 µm, especially between 2 µm and 50 µm, in particular of approximately 10 µm,
- the two orthogonal dimensions of the filiform nanoparticles are the diameter of the transverse cross-section of the filiform nanoparticles,
- the inorganic filler of a hybrid material according to the invention is formed of a material selected from the group formed of inorganic piezoelectric ceramics, pyroelectric ceramics, and piezoelectric and pyroelectric ceramics,
- the inorganic filler of a hybrid material according to the invention is formed of a material selected from the group of the inorganic ceramics, especially ceramics of the perovskite type, for example barium titanate of the formula $BaTiO_3$, lead zirconate titanates (PZT) of the formula $PbZr_xTi_{1-x}O_3$, $Ba_xSr_{1-x}TiO_3$, $Ca_xSr_{1-x}TiO_3$, $BaTi_xZr_{1-x}O_3$, where x is a real number which can be zero or equal to 1 or between 0 and 1, $SrTiO_3$, $BaZrO_3$, $SrZrO_3$, $PbTiO_3$, $KNbO_3$, $LiNbO_3$, PMN-PT (Pb/Mg/Nb—Pb/Ti), barium dititanate ($BaTi_2O_5$) and niobate ($NaNbO_3$),
- the solid dielectric matrix of the hybrid material comprises at least one polymer material selected from the group formed of thermoplastic polymer materials and thermosetting polymer materials,
- the solid dielectric matrix of the hybrid material is formed of an organic polymer material selected from the group formed of piezoelectric materials, pyroelectric materials, and piezoelectric and pyroelectric materials. For example, the organic polymer material of the solid dielectric matrix is selected from the group formed of PVDF, PVDF-TrFE, fluorinated terpolymers (copolymers formed of three separate monomer units), odd polyamides, PEEK (polyether ether ketone), even polyamides, polyurethanes and silicones.

Advantageously, the hybrid material has a low dielectric permittivity value, especially less than 20, and a piezoelectric figure of merit $g_{33}$ greater than 45 mV·m/N and/or a pyroelectric figure of merit F greater than 0.7 µC/K/m² and final mechanical properties which are substantially retained (especially to the extent of more than 90%) in relation to the solid dielectric matrix.

Advantageously and according to the invention, the inorganic filler is distributed substantially uniformly in the solid dielectric matrix. Substantially uniform distribution of the inorganic filler in the solid dielectric matrix means that the average distance separating adjacent filiform nanoparticles is substantially constant throughout the volume of the solid dielectric matrix.

Advantageously and according to the invention, the filiform nanoparticles are selected from the group formed of nanowires, nanorods and nanotubes.

In a first variant of a hybrid material according to the invention, a filiform nanoparticle within the scope of the invention is a nanorod or a nanowire. In this first variant, the two orthogonal dimensions of a filiform nanoparticle are the diameter of its transverse cross-section. A filiform nanoparticle can also be a ribbon in which the two orthogonal dimensions of the filiform nanoparticle according to the invention are its width (first orthogonal dimension) and its thickness (second orthogonal dimension).

In a second variant of a hybrid material according to the invention, the filiform nanoparticles within the scope of the invention can also be nanotubes formed of a hollow cylinder having a wall thickness of less than 100 nm.

Advantageously and according to the invention, when the filiform nanoparticles are nanotubes, the filiform nanoparticles have a wall forming said nanotube of a thickness substantially less than 100 nm.

Advantageously and according to the invention, the main directions of elongation of the filiform nanoparticles of the inorganic filler distributed in the dielectric matrix have a substantially isotropic distribution in the solid dielectric matrix. Substantially isotropic distribution of the main directions of elongation of the filiform nanoparticles in the solid dielectric matrix is understood as meaning that the main directions of elongation of the filiform nanoparticles do not have, on average, a preferential orientation in the solid dielectric matrix but instead extend equally in all directions.

Advantageously, the filiform nanoparticles distributed in the dielectric matrix have a substantially homogeneous distribution in the solid dielectric matrix.

In addition, the inventors have also found that such a hybrid material in which the nanoparticles having a high aspect ratio are distributed in an isotropic and homogeneous manner in the solid dielectric matrix in a proportion by volume of less than 50% permits deformability of said nanoparticles and a connectivity between said nanoparticles which are sufficient to obtain the required piezoelectric and/or pyroelectric effects. In particular, the inventors have observed that such a proportion by volume of filiform nanoparticles permits sufficient connectivity between the filiform nanoparticles to allow conduction by interaction between the filiform nanoparticles with a small proportion of said filiform nanoparticles.

Advantageously and according to the invention, the hybrid material further comprises a filler, called conductive filler, of an electrically conductive material comprising conductive nanowires having:

a length extending in a main direction of elongation of the conductive nanowires, two dimensions, called orthogonal dimensions, extending in two transverse directions which are mutually orthogonal and orthogonal to said main direction of elongation of the conductive nanowires, said orthogonal dimensions being smaller than said length and smaller than 500 nm, and two ratios, called aspect ratios, between said length and each of the two orthogonal dimensions of the conductive nanowires, said aspect ratios being greater than 50, in which said conductive nanowires are distributed in the volume of the solid dielectric matrix in an amount by volume of less than 1%, especially substantially of approximately 0.5%.

In a variant, advantageously and according to the invention, such a piezoelectric and/or pyroelectric hybrid material according to the invention is characterised by at least one of the following features:

the two orthogonal dimensions of the conductive nanowires are between 50 nm and 300 nm, especially approximately 200 nm, the conductive nanowires have a length greater than 1 µm, especially between 30 µm and 300 µm, in particular of approximately 50 µm, the two orthogonal dimensions of the conductive nanowires are the diameter of the transverse cross-section of the conductive nanowires, the conductive nanowires have two aspect ratios greater than 50, especially of approximately 250, the conductive nanowires are selected from the group formed of nanorods and nanotubes, especially carbon nanotubes, the conductive nanowires are formed of a material selected from the group formed of gold, silver, nickel, cobalt, copper and their alloys, in the non-oxidised state, the conductive nanowires are formed of a non-oxidised metallic material, it comprises an amount of conductive nanowires of between 0.1% and 1% by volume.

Advantageously, the amount of conductive nanowires in the hybrid material is adjusted so that, in terms of fraction by volume, it is below the electrical percolation threshold in the solid dielectric material used.

Advantageously and according to the invention there are used conductive nanowires the two aspect ratios of which are greater than 50, in particular between 50 and 5000, more particularly between 100 and 1000, particularly and advantageously approximately 250.

Advantageously and according to the invention, the proportion by mass of the conductive nanowires relative to the solid dielectric matrix is greater than 0.014%.

The invention extends to a method for obtaining a hybrid material according to the invention.

The invention relates also to a method for obtaining a composite solid material, called hybrid material, in which there is prepared a dispersion of an inorganic filler comprising filiform nanoparticles formed of an inorganic material selected from the group formed of piezoelectric materials, pyroelectric materials, and piezoelectric and pyroelectric materials, and optionally conductive nanowires, said filiform nanoparticles having:

a length extending in a main direction of elongation of the filiform nanoparticles, two dimensions, called orthogonal dimensions, extending in two transverse directions which are mutually orthogonal and orthogonal to said main direction of elongation of the filiform nanoparticles, said orthogonal dimensions being smaller than said length and smaller than 500 nm, and two ratios, called aspect ratios, between the length and each of the two orthogonal dimensions, said aspect ratios being greater than 10, in a liquid precursor composition of a solid dielectric material, in such a manner as to obtain an amount by volume of filiform nanoparticles in said hybrid material of less than 50% and in such a manner that the main directions of elongation of the filiform nanoparticles of the inorganic filler distributed in the dielectric matrix have a substantially isotropic distribution in the solid dielectric matrix.

Advantageously and according to the invention:

the dispersion of filiform nanoparticles, and optionally of conductive nanowires, is prepared in a liquid solvent medium, the dispersion is mixed into the liquid precursor composition, the liquid solvent is removed, and the hybrid material is placed in an electric field suitable for permitting polarisation of the filiform nanoparticles and their conversion into piezoelectric and/or pyroelectric filiform nanoparticles.

The step of polarisation of the filiform nanoparticles of the hybrid material is carried out by means which are known per se to the person skilled in the art and are suitable for permitting conversion of the filiform nanoparticles into filiform nanoparticles having on the macroscopic scale piezoelectric and/or pyroelectric properties.

Advantageously and according to the invention, when the solid dielectric matrix comprises at least one polymer material, the liquid precursor composition is a solution of said polymer material in a liquid solvent selected from the solvent of the dispersion of filiform nanoparticles, and optionally of conductive nanowires, and solvents that are miscible with the solvent of the dispersion of filiform nanoparticles. Advantageously, the liquid precursor composition is a dilute solution of said polymer material in the liquid solvent.

Advantageously and according to the invention, when the solid dielectric matrix comprises at least one thermoplastic material, the liquid precursor composition is formed of the solid dielectric matrix in the molten state. Advantageously, the liquid precursor composition is a condensed solution of said polymer material.

Advantageously, the dispersion of said inorganic filler comprising filiform nanoparticles in said liquid precursor composition of the solid dielectric matrix is prepared by any means known per se to the person skilled in the art, especially by twin-screw extrusion.

Advantageously and according to the invention, when the solid dielectric matrix comprises at least one thermosetting material, the liquid precursor composition is formed of at least one liquid composition involved in the composition of the thermosetting material.

Advantageously, a dispersion of the filiform nanoparticles, and optionally of the conductive nanowires, is prepared in a liquid solvent, the dispersion is mixed into the liquid precursor composition, and the liquid solvent is removed. Said liquid solvent is preferably selected from solvents that are not liable to oxidise the conductive nanowires, or that are liable to oxidise them only partially and in a limited manner.

Furthermore, advantageously and according to the invention, when the solid dielectric matrix comprises at least one polymer material, the liquid precursor composition is a solution of said polymer material in a liquid solvent selected from the solvent of the dispersion of filiform nanoparticles, solvents that are miscible with the solvent of the dispersion of filiform nanoparticles. The dispersion of filiform nanoparticles can advantageously be incorporated into said liquid precursor composition during a step of production of the solid dielectric matrix.

In addition, advantageously and according to the invention, the dispersion of the filiform nanoparticles in the liquid precursor composition is subjected to ultrasound.

Furthermore, there are advantageously used in a method according to the invention filiform nanoparticles, and optionally conductive nanowires, according to at least one of the features mentioned above.

Advantageously and according to the invention, the intensity of the electric field applied to the hybrid material is between 1 kV/mm and 10 kV/mm.

The invention extends also to the use of such a hybrid material in the production of structural parts and of supported films deposited on all or part of the surface of such a support.

In particular, such a hybrid material according to the invention is used to permit:

the detection of a mechanical stress at the surface of said hybrid material by direct piezoelectric effect, or the detection of a temperature variation at the surface of said hybrid material by direct pyroelectric effect.

In a variant according to the invention, such a hybrid material is used in applications relating, for example, to an energy sensor/converter for creating a static or dynamic mechanical wave by inverse piezoelectric effect in applications relating to:

a flexible audio device, and/or a mechanical actuator, and/or a de-icing device, and/or a mechanical antifouling device.

In another variant according to the invention, such a hybrid material is used in applications relating to a soundproofing material, especially an anechoic material, suitable for permitting absorption of an audible vibrational wave and dissipation of the energy of said vibrational wave by the Joule effect, on a local scale, via the conductive nanowires.

The invention relates also to a composite material, to a method for obtaining such a composite material, and to the use of such a piezoelectric and/or pyroelectric composite solid material, which are characterised in combination by all or some of the features mentioned hereinabove or hereinbelow.

Other objects, features and advantages of the invention will become apparent upon reading the following description, which refers to the examples, which are not intended to be limiting, and to the accompanying figures, in which:

FIG. 1 is a descriptive synoptic diagram of a method for producing a piezoelectric and/or pyroelectric hybrid material according to the invention, FIG. 2 is a diagrammatic view, in transverse section, of a piezoelectric and/or pyroelectric hybrid material according to the invention, FIG. 3 is a diagrammatic view, in transverse section, of a variant of a piezoelectric and/or pyroelectric hybrid material according to the invention.

In a method according to the invention shown in FIG. 1, filiform nanoparticles 1, that is to say nanoparticles having a high aspect ratio, formed of a piezoelectric and/or pyroelectric and/or ferroelectric solid material are used. Such a material is obtained by a method known per se to the person skilled in the art, especially by vapour phase deposition or by chemical means in the presence of coordination ligands, as described, for example, in "Urban et al., (2001), *Journal of the American Chemical Society*, 124(7), 1186-1187". In particular, such a method for producing piezoelectric, pyroelectric filiform nanoparticles by a process of electrodeposition in the channels of a porous membrane is described in Example 1 below.

A dispersion 3 of the piezoelectric and/or pyroelectric filiform nanoparticles 1 in a liquid precursor solution 2 of a solid dielectric matrix 11 is prepared. The dispersion 3 is prepared by means known per se to the person skilled in the art, especially by mechanical mixing or by ultrasound treatment. In particular, the dispersion means are suitable for forming an isotropic distribution of the filiform nanoparticles 1 in the liquid precursor solution 2 of a solid dielectric matrix 11 and in the solid dielectric matrix 11. The liquid precursor solution 2 of the solid dielectric matrix 11 can be a solution of a thermoplastic polymer in a solvent medium of said polymer.

The hybrid material according to the invention is formed by evaporation 4 of the liquid solvent medium at a temperature greater than the vaporisation temperature of said liquid solvent medium. There is obtained a hybrid material formed of filiform nanoparticles 1 dispersed in a homogeneous and isotropic manner in the solid dielectric matrix 11.

There is then carried out a step 5 of forming of said hybrid material, especially by thermoforming of the resulting thermoplastic material, suitable for permitting the formation of a sheet of said hybrid material, of a film of small thickness of said hybrid material or alternatively of a layer of said hybrid material forming the surface of a support 14. The outer surface of the support 14 can be of any shape, but in the embodiment shown in FIG. 2 and in FIG. 3 the outer surface of the support 14 is flat.

The hybrid material is then equipped, by apposition 6, with two electrically conductive plates 10, 13 forming two electrodes in contact with the two main faces of the hybrid material, and a potential difference suitable for permitting polarisation 7 of the composite solid material is applied between the two electrodes. The two electrodes 10, 13 are further suitable for permitting the transfer of electrical energy from the composite solid material for a direct piezoelectric effect or a direct pyroelectric effect. The two electrodes 10, 13 are also suitable for the transfer of electrical energy to the hybrid material for an inverse piezoelectric effect.

In a variant which is not shown, it is also possible for the liquid precursor solution 2 of a solid dielectric matrix 11 to be composed of only one of the components necessary for the polymerisation of a thermosetting solid dielectric matrix 11. In this case, the formation of the solid dielectric matrix 11 is obtained by subsequently adding the other of the components necessary for the polymerisation of the thermosetting solid dielectric matrix 11 prior to step 5 of forming of said hybrid material. A hybrid material according to the invention shown in FIG. 2 comprises piezoelectric and/or pyroelectric filiform nanoparticles 12 of barium titanate having a high aspect ratio, which are distributed in a homogeneous and isotropic manner in a thermosetting solid dielectric matrix 11. The filiform nanoparticles 12 of barium titanate have an average length of substantially approximately 10 μm, an average diameter of substantially approximately 200 nm and an aspect ratio of approximately 50.

In a use of a hybrid material according to the invention for direct or inverse piezoelectric applications and for direct pyroelectric applications, the hybrid material forms an electrical contact with a flexible polymer substrate 14 which has previously been coated with a conductive electrode 13. The piezoelectric and/or pyroelectric hybrid material can further be used in the form of a patch which is to be fixed to said polymer substrate 14.

A hybrid material according to the invention shown in FIG. 3 comprises piezoelectric and/or pyroelectric filiform nanoparticles 12 of barium titanate having a high aspect ratio and electrically conductive nanoparticles 15 distributed in a homogeneous and isotropic manner in a thermosetting solid dielectric matrix 11. The electrically conductive nanoparticles 15 are selected from conductive nanoparticles, conductive nanowires or carbon nanotubes. The fraction of electrically conductive nanoparticles 15 is adjusted so that, in terms of fraction by volume, it is below the electrical percolation threshold (above which the electrically conductive nanoparticles 15 form an electrically conductive continuum in the dielectric matrix 11) in the solid dielectric matrix 11 used. The hybrid material produced from a thermoplastic matrix 11 is thermoformed on a solid substrate. The hybrid material produced from a thermosetting matrix 11 is polymerised on a solid substrate which has previously been metallised on the surface in question.

In the case where the functional filler of the hybrid material is composed of piezoelectric and/or pyroelectric filiform nanoparticles 12 and electrically conductive nanoparticles 15, the vibrations applied to the substrate propagate into the piezoelectric hybrid material. The mechanical waves are converted into electrical energy via the piezoelectric filiform nanoparticles 12 having a high aspect ratio, and the electric charges so generated are dissipated by the electrically conductive nanoparticles 15. The mechanical propagation wave and the vibrations of the substrate are accordingly damped via the conversion by inverse piezoelectric effect of the nanoparticles having a high aspect ratio in the form of barium titanate.

EXAMPLE 1

Preparation of Barium Titanate Nanowires Having a High Aspect Ratio $BaTiO_3$ nanowires are synthesised by electrodeposition of an aqueous solution of barium titanate in the pores of an alumina filtration membrane (PAA, *Porous Anodised Alumina*, Whatmann, Ref. 6809-5022 or 6809-5002) having a thickness of 50 μm and a porosity of 200 nm. The barium titanate sol is prepared by dissolving 3 g of barium acetate (Ref. 255912, Sigma-Aldrich, Lyon, France) and 3.3 g of titanium isopropoxide (Ref. 377996, Sigma-Aldrich, Lyon, France) in 20.16 ml of glacial acetic acid (Ref. A9967, Sigma-Aldrich, Lyon, France) in the presence of 3.27 ml of ethylene glycol (Ref. 324558, Sigma-Aldrich, Lyon, France) and 2 liters of water. The final pH of the prepared sol is 5. The filtration membrane is placed in the barium titanate sol so that one of the main faces of the filtration membrane is in tight contact with the surface of an aluminium sheet which has previously been coated with a conductive layer of silver and which forms the cathode of the electrodeposition device. The anode of the device is formed by a wire of pure metal, for example of gold or platinum, which extends facing the opposite surface of the filtration membrane and is immersed in the barium titanate sol.

A voltage of 5 V is applied between the cathode and the anode in such a manner that the initial intensity of the electric current is close to 150 μA. The barium titanate sol is thus deposited in the pores of the porous membrane. After the electrodeposition step, a step of annealing heat treatment of the barium titanate nanowires is carried out at a temperature of approximately 600° C. in atmospheric air so as to form the ceramic nanowires.

The porous membrane is dissolved by treatment in an aqueous sodium hydroxide solution at a concentration of 48 g/liter. After 15 minutes' treatment, the ceramic barium titanate nanowires having a high aspect ratio are liberated in the alkaline solution. The nanowires are separated from the alkaline solution, washed and stored in an organic solvent, for example N,N-dimethylacetamide ($CH_3$—CO—$N(CH_2)_2$, Ref. D5511, Sigma-Aldrich, Lyon, France). The ceramic barium titanate nanowires have an average diameter of approximately 200 nm and an average length of approximately 50 µm for a length-to-diameter ratio (aspect ratio) substantially close to 250.

EXAMPLE 2

Preparation of Barium Titanate Nanotubes Having a High Aspect Ratio

A $BaTiO_3$ sol is prepared as described in Example 1. The $BaTiO_3$ sol is deposited on one of the main surfaces of an alumina filtration membrane (PAA) having a thickness of 50 µm and a porosity of 200 nm, in such a manner as to form a layer coating the inner surface of the pores of said filtration membrane. The porous membrane is dried at a temperature of 100° C., and then a step of annealing heat treatment of the $BaTiO_3$ nanotubes is carried out at a temperature of approximately 600° C. in atmospheric air. Alkaline treatment of the porous membrane and then washing are carried out as described in Example 1 in order to form a suspension of the $BaTiO_3$ nanotubes in an organic solvent, for example N,N-dimethylacetamide.

EXAMPLE 3

Preparation of a Piezoelectric and/or Pyroelectric Composite Hybrid Material Formed of $BaTiO_3$ Nanowires Dispersed in a Thermoplastic Dielectric Matrix 11 of Polyamide 11

250 mg of $BaTiO_3$ nanowires having an aspect ratio of 25, as described in Example 1, are dispersed in 20 ml of N,N-dimethylacetamide. The dispersion is subjected to dispersion treatment in an ultrasound bath having a frequency of substantially approximately 20 kHz, for a dispersed power of approximately 500 W. On the other hand, 250 mg of Polyamide 11 (PA11, Rilsan® polyamide 11, ARKEMA, USA) are dissolved in 20 ml of N,N-dimethylacetamide. The mixture is homogenised by ultrasound treatment. After evaporation of the N,N-dimethylacetamide and hot thermoforming there is obtained a composite hybrid film having a thickness of 150 µm, in which the charge of filiform $BaTiO_3$ nanoparticles in the matrix of polyamide 11 is 12% by volume.

In a variant, the film of composite hybrid material is deposited in the form of a patch on the surface of a substrate at ambient temperature, or alternatively it is formed by heat treatment on the surface of an electrically conductive substrate.

An electrode is placed on each of the two main faces of the resulting film of composite hybrid material, and the composite hybrid material is subjected to a polarisation treatment by application of an electric field having an intensity of 3 kV/mm at a temperature of 100° C. for 30 minutes.

There is obtained a composite hybrid material according to the invention having a dielectric permittivity close to 5, a value of the pyroelectric figure of merit F greater than 0.7 $\mu C/K/m^2$ and a value of the piezoelectric figure of merit $g_{33}$ greater than 45 mV·m/N, while the mechanical ductility of the polyamide 11 matrix is substantially retained.

The application of a mechanical compressive stress at the surface of the solid composite or a twisting stress induces variation of the macroscopic dipole of the composite solid material. Such materials can therefore be used as shock or deformation sensors or in systems for converting mechanical energy into electrical energy.

The application of a temperature variation at the surface of the composite solid hybrid material according to the invention induces variation of the macroscopic dipole of said composite solid material. Such materials can therefore advantageously be used as heat sensors or in systems for converting heat energy into electrical energy.

The application of a voltage, constant or alternating, to the two main faces of the composite solid hybrid material according to the invention induces deformation of said material, generating a surface stress. Such materials can therefore advantageously be used as transducers for converting electrical energy into mechanical energy.

EXAMPLE 4

Preparation of a Piezoelectric and/or Pyroelectric Composite Solid Hybrid Material Formed of $BaTiO_3$ Nanowires in a Thermosetting Polyurethane Matrix 132 mg of ceramics nanowires ($BaTiO_3$) having an aspect ratio of 25, as described in Example 1, are dispersed in 100 mg of acrylic resin (Mapaero, Pamiers, France). The suspension of ceramics nanowires in the acrylic resin is subjected to ultrasound at a frequency of 50 kHz under a power of 500 W. 32 mg of isocyanate (Mapaero, Pamiers, France) are introduced into the suspension. The mixture is homogenised under ultrasound. The solution is then deposited on an electrically conductive substrate. After polymerisation there is obtained a piezoelectric and pyroelectric composite solid hybrid film having a thickness of 100 µm and charged at 12% by volume.

An electrode is placed on the main face of the composite solid hybrid film opposite the electrically conductive substrate, and an electric field of 3 kV/mm is applied to said hybrid solid composite at a temperature of 100° C. for 30 minutes. There is thus obtained by polarisation a composite solid hybrid material having a dielectric permittivity close to 5, a pyroelectric figure of merit F greater than 0.7 $\mu C/K/m^2$ and a piezoelectric figure of merit $g_{33}$ greater than 45 mV·m/N.

As a descriptive example of an electroactive material of the prior art, for comparison with the characteristics of a composite solid hybrid material according to the invention described in Examples 3 and 4, a barium titanate ceramic has a value of the pyroelectric figure of merit F of 0.15 $\mu C/K/m^2$, a value of the piezoelectric figure of merit $g_{33}$ of 15 mV·m/N. Such a ferroelectric ceramic of barium titanate has high mechanical fragility.

The application of a mechanical stress at the surface of the composite solid hybrid material induces variation of the macroscopic dipole of the composite solid material. Such materials can therefore be used as shock or deformation sensors or in systems for converting mechanical energy into electrical energy.

The application of a temperature variation at the surface of the composite solid hybrid material induces variation of the macroscopic dipole of said material. Such a material can therefore advantageously be used as heat sensors or in systems for converting heat energy into electrical energy.

EXAMPLE 5

Preparation of a Flexible Acoustic Device from a Composite Formed of Piezoelectric Nanowires Having a High Aspect Ratio Dispersed in a Polymer Matrix A hybrid material according to the invention is produced according to Example 3. The hybrid material produced from a thermoplastic matrix of polyamide 11 is thermoformed on a flexible polymer substrate (polyethylene) having a thickness of 70 µm and a size of 1 m×1 m.

It is possible to adjust the electric impedance of the hybrid material applied to the substrate by varying the thickness of the layer of said material and the area of the surface over which the hybrid material is deposited, so that the electric impedance of the hybrid material is adapted to the electric impedance of the voltage generator.

A voltage of 5V and a variable frequency of between 500 Hz and 20 kHz is applied to the two main faces of the composite solid hybrid material according to the invention. The deformation of the composite solid hybrid material and of the substrate under the action of the electric field induces at the surface of the acoustic device a stress which has a frequency equal to the frequency of the applied field and generates an audible sound.

Because the ductility of the matrix of the solid composite and of the polymer substrate is retained and the power consumption of the system is low, the flexible acoustic device is an alternative to the use of conventional electromagnetic baffles.

EXAMPLE 6

Preparation of a Flexible Acoustic Device from a Hybrid Material Formed of Piezoelectric Nanowires Having a High Aspect Ratio Dispersed in a Thermosetting Polyurethane Matrix A composite solid hybrid material according to the invention is produced according to Example 4. The composite solid hybrid material produced from a thermosetting polyurethane matrix is applied for the purpose of its polymerisation to a flexible polyethylene substrate having a thickness of 70 µm and a size of 1 m×1 m, which has previously been metallised on the surface to which said composite solid hybrid material is applied. An acoustic device according to the invention is obtained according to a method as described in Example 5.

EXAMPLE 7

Preparation of a Piezoelectric and/or Pyroelectric Composite Solid Hybrid Material Formed of $NaNbO_3$ Nanowires in a Thermoplastic Polyamide Matrix Sodium niobate $NaNbO_3$ nanowires are synthesised by dissolving 1 g of niobium pentoxide in 60 ml of sodium hydroxide at a concentration of 10 mM and treating the resulting solution in an autoclave having a capacity of 25 ml at a temperature of 180° C. for 8 hours. There are obtained filiform nanoparticles (nanowires) having an aspect ratio greater than 30 and a non-centrosymmetric crystal structure of the orthorhombic type.

100 mg of $NaNbO_3$ nanowires are mixed with 20 ml of N,N-dimethylacetamide. The resulting suspension is subjected to treatment with ultrasound (frequency approximately 20 kHz) for a dispersed power of approximately 500 W. In addition, 200 mg of polyamide 11 are dissolved in 20 ml of N,N-dimethylacetamide. The solution containing the $NaNbO_3$ nanowires and the solution of polyamide 11 are mixed, and the resulting mixture is homogenised under ultrasound. The N,N-dimethylacetamide is evaporated off. A step of hot thermoforming of the composite solid material is carried out in order to form a composite film having a thickness of between 30 µm and 1 mm. The fraction by volume of the inorganic phase in the dielectric matrix is 10%.

An electrically conductive electrode is deposited on each of the main faces of the composite film, and an electric field of 10 kV/mm is applied at a temperature of 130° C. for 10 minutes. There is obtained a piezoelectric and/or pyroelectric composite film having piezoelectric and/or pyroelectric properties in a temperature range of between −100° C. and +180° C.

The invention claimed is:

1. A piezoelectric and/or pyroelectric composite solid material, called hybrid material, comprising:
    a solid dielectric matrix (11),
    an inorganic filler distributed in the solid dielectric matrix (11), said inorganic filler being composed of a material selected from the group formed of piezoelectric materials, pyroelectric materials, and piezoelectric and pyroelectric materials,
    said inorganic filler comprising solid nanoparticles, called filiform nanoparticles (12), having:
        a length extending in a main direction of elongation of the filiform nanoparticles (12),
        two dimensions, called orthogonal dimensions, extending in two transverse directions which are mutually orthogonal and orthogonal to said main direction of elongation of the filiform nanoparticles (12), said orthogonal dimensions being smaller than 500 nm,
        said length extending in a main direction of elongation being larger than said orthogonal dimensions, and
        two ratios, called aspect ratios, between said length and each of the two orthogonal dimensions, said aspect ratios being greater than 10,
    wherein,
    said filiform nanoparticles (12) are distributed in the volume of the solid dielectric matrix (11) in an amount by volume of less than 50%, and
    the main directions of elongation of the filiform nanoparticles (12) of the inorganic filler distributed in the dielectric matrix (11) have a substantially isotropic distribution in the solid dielectric matrix (11).

2. The material as claimed in claim 1, wherein the inorganic filler is distributed substantially uniformly in the solid dielectric matrix (11).

3. The material as claimed in claim 1, wherein the filiform nanoparticles (12) are selected from the group consisting of nanowires, nanorods and nanotubes.

4. The material as claimed in claim 1, wherein said length extending in a main direction of elongation of the filiform nanoparticles (12) is greater than 1 µm.

5. The material as claimed in claim 1, wherein the inorganic filler is formed of a material selected from the group of the inorganic ceramics.

6. The material as claimed in claim 1, wherein the solid dielectric matrix (11) comprises at least one polymer material selected from the group formed of thermoplastic polymer materials and thermosetting polymer materials.

7. The material as claimed in claim 1, further comprising:
a filler, called conductive filler, of an electrically conductive material comprising conductive nanowires (15) having:
   a length extending in a main direction of elongation of the conductive nanowires (15),
   two dimensions, called orthogonal dimensions, extending in two transverse directions which are mutually orthogonal and orthogonal to said main direction of elongation of the conductive nanowires (15), said orthogonal dimensions being smaller than 500 nm,
   said length extending in a main direction of elongation being larger than said orthogonal dimensions, and
   two ratios, called aspect ratios, between said length and each of the two orthogonal dimensions of the conductive nanowires (15), said aspect ratios being greater than 50, in which said conductive nanowires (15) are distributed in the volume of the solid dielectric matrix (11) in an amount by volume of less than 1%.

8. A method for obtaining a composite solid material, called hybrid material, comprising:
   preparing a dispersion of an inorganic filler comprising filiform nanoparticles (12) formed of an inorganic material selected from the group consisting of piezoelectric materials, pyroelectric materials, and piezoelectric and pyroelectric materials, said filiform nanoparticles (12) having:
      a length extending in a main direction of elongation of the filiform nanoparticles (12),
      two dimensions, called orthogonal dimensions, extending in two transverse directions which are mutually orthogonal and orthogonal to said main direction of elongation of the filiform nanoparticles (12), said orthogonal dimensions being smaller than 500 nm,
      said length extending in a main direction of elongation being larger than said orthogonal dimensions, and
      two ratios, called aspect ratios, between the length and each of the two orthogonal dimensions, said aspect ratios being greater than 10,
   in a liquid precursor composition (2) of a solid dielectric matrix (11),
      said preparing of said dispersion being carried out in such a manner as to obtain an amount by volume of filiform nanoparticles (12) in said hybrid material of less than 50%, and
      said preparing of said dispersion being carried out in such a manner that the main directions of elongation of the filiform nanoparticles (12) of the inorganic filler distributed in the dielectric matrix (11) have a substantially isotropic distribution in the solid dielectric matrix (11).

9. The method as claimed in claim 8, wherein:
   the dispersion of filiform nanoparticles (12) is prepared in a liquid solvent medium,
   the dispersion is mixed into the liquid precursor composition (2),
   the liquid solvent is removed, and
   the hybrid material is placed in an electric field suitable for permitting polarisation of the filiform nanoparticles (12) and their conversion into piezoelectric and/or pyroelectric filiform nanoparticles (12).

10. The method as claimed in claim 8, wherein, when the solid dielectric matrix (11) comprises at least one polymer material, the liquid precursor composition (2) is a solution of said polymer material in a liquid solvent selected from the solvent of the dispersion of filiform nanoparticles (12) and solvents that are miscible with the solvent of the dispersion of filiform nanoparticles (12).

11. The method as claimed in claim 8, wherein, when the solid dielectric matrix (11) comprises at least one thermoplastic material, the liquid precursor composition (2) is formed of the solid dielectric matrix (11) in the molten state.

12. The method as claimed in claim 8, wherein, when the solid dielectric matrix (11) comprises at least one thermosetting material, the liquid precursor composition (2) is formed of at least one liquid composition involved in the composition of the thermosetting material.

13. The method as claimed in claim 8, wherein the dispersion of filiform nanoparticles (1) in the liquid precursor composition (2) is subjected to ultrasound.

14. The method as claimed in claim 8, wherein the intensity of the electric field applied to the hybrid material is between 1 kV/mm and 10 kV/mm.

15. The material as claimed in claim 2 wherein the filiform nanoparticles (12) are selected from the group consisting of nanowires, nanorods and nanotubes.

\* \* \* \* \*